(12) United States Patent
Mysliwitz et al.

(10) Patent No.: US 8,694,726 B2
(45) Date of Patent: Apr. 8, 2014

(54) MEMORY MODULE SYSTEM

(75) Inventors: Daniel Mysliwitz, Munich (DE); Jens Niemax, Unterhaching (DE)

(73) Assignee: Qimonda AG, Munich (DE)

( * ) Notice: Subject to any disclaimer, the term of this patent is extended or adjusted under 35 U.S.C. 154(b) by 891 days.

(21) Appl. No.: 11/928,823

(22) Filed: Oct. 30, 2007

(65) Prior Publication Data

US 2008/0140900 A1 Jun. 12, 2008

(30) Foreign Application Priority Data

Oct. 30, 2006 (DE) .......................... 10 2006 051 136

(51) Int. Cl.
*G06F 12/00* (2006.01)
*G06F 13/00* (2006.01)
*G06F 13/28* (2006.01)

(52) U.S. Cl.
USPC ........................... 711/115; 711/103; 710/304

(58) Field of Classification Search
USPC .................................. 710/304; 711/103, 115
See application file for complete search history.

(56) References Cited

U.S. PATENT DOCUMENTS

| | | | | |
|---|---|---|---|---|
| 5,153,757 A | * | 10/1992 | Cloonan et al. | 398/54 |
| 5,172,259 A | * | 12/1992 | Cloonan et al. | 398/58 |
| 5,621,678 A | * | 4/1997 | Barnaby et al. | 365/52 |
| 5,887,145 A | * | 3/1999 | Harari et al. | 710/301 |
| 6,772,261 B1 | | 8/2004 | D'Antonio et al. | |
| 6,981,068 B1 | * | 12/2005 | Harari et al. | 710/2 |
| 7,216,196 B2 | * | 5/2007 | Jeddeloh | 711/5 |
| 7,539,024 B1 | * | 5/2009 | Karabatsos | 361/785 |
| 2003/0143790 A1 | * | 7/2003 | Wu | 438/197 |
| 2004/0004822 A1 | * | 1/2004 | Ruckerbauer et al. | 361/785 |
| 2004/0039876 A1 | * | 2/2004 | Nelson et al. | 711/115 |
| 2004/0177302 A1 | * | 9/2004 | Mori et al. | 714/738 |
| 2005/0071580 A1 | | 3/2005 | LeClerg et al. | |
| 2005/0138267 A1 | * | 6/2005 | Bains et al. | 711/100 |
| 2005/0160223 A1 | * | 7/2005 | Chen et al. | 711/115 |
| 2006/0198114 A1 | * | 9/2006 | Coutancier et al. | 361/788 |
| 2007/0033362 A1 | * | 2/2007 | Sinclair | 711/165 |
| 2007/0038907 A1 | * | 2/2007 | Jeddeloh et al. | 714/718 |
| 2007/0178864 A1 | * | 8/2007 | Kiehl et al. | 455/186.1 |
| 2008/0126863 A1 | * | 5/2008 | Co et al. | 714/29 |
| 2009/0106504 A1 | * | 4/2009 | Skerlj et al. | 711/154 |

FOREIGN PATENT DOCUMENTS

GB 2296999 A * 7/1996
WO WO 2005032071 A2 * 4/2005

OTHER PUBLICATIONS

Definition of "firmly", Merriam-Webster Online Dictionary (retrieved May 18, 2010).*

* cited by examiner

*Primary Examiner* — Yaima Rigol
(74) *Attorney, Agent, or Firm* — Dicke, Billig & Czaja, PLLC

(57) ABSTRACT

A memory module system, a method for operating a memory module system, and an adapter card is disclosed. One embodiment provides last one memory buffer device, and a first plug mechanism for connecting the adapter card to a memory module system, and a second plug mechanism for connecting the adapter card to a memory module.

23 Claims, 3 Drawing Sheets

MEMORY MODULE SYSTEM

CROSS-REFERENCE TO RELATED APPLICATIONS

This Utility Patent Application claims priority to German Patent Application No. DE 10 2006 051 136.0 filed on Oct. 30, 2006, which is incorporated herein by reference.

BACKGROUND

The invention relates to a memory module system, an adapter card, an adapter card with a data buffer device, and in one embodiment an advanced memory buffer (AMB), and to a method for operating a memory module system.

Conventional computers, e.g., PCs (personal computers), laptops, notebooks, workstation computers, server computers, etc., generally include a main printed circuit board, the motherboard, on which one or a plurality of CPUs (central processor units) may be provided, as well as one or a plurality of memory controllers, an appropriate BIOS component, and one or a plurality of plug contacts for memory modules, etc.

The different components of the motherboard, e.g., the above-mentioned memory modules, the CPU, the memory controller, etc. may—for the exchange of corresponding data, address, and/or control signals—be connected with each other via one or a plurality of bus systems.

As memory cards—to be plugged into the above-mentioned plug contacts—appropriate unbuffered DIMM memory modules may, for instance, be used (DIMM=Dual In-Line Memory Module) which each include a plurality of memory devices, e.g., a plurality of RAM memory devices, in one embodiment DRAMs (DRAM=Dynamic Random Access Memory).

In a plurality of applications—in one embodiment e.g., with server or workstation computers, etc.—memory modules with upstream data buffer elements (buffers), e.g., "R-DIMMs" (R-DIMM=registered DIMM), "FB-DIMMs" (FB-DIMM=Fully Buffered DIMM), etc. may also be used instead of the above-mentioned unbuffered memory modules.

In the case of conventional memory module systems with buffered memory modules, a plurality of FB-DIMMs may, for instance, be inserted into corresponding memory plug contacts of a motherboard and thus be connected in series in the form of a corresponding "daisy chain".

In the case of R-DIMMs, the address and control signals—which are, for instance, output by the memory controller or by the CPU—may be (shortly) buffered by appropriate buffer devices ("registers") of the respective R-DIMM, and correspondingly similar address and control signals may—in a time-coordinated, possibly multiplexed or demultiplexed manner or in a converted form, respectively—be transmitted to the memory devices, e.g., DRAMs, of the corresponding registered DIMM.

Contrary to this, the (reference) data signals—output by the memory controller or the CPU, respectively—may directly, i.e. without buffering by a corresponding buffer device, be transmitted to the memory devices (and—vice versa—also the (reference) data signals output by the memory devices directly—without the interconnection of a corresponding buffer device—to the memory controller or the respective processor, respectively).

Contrary to this, in the case of FB-DIMM memory modules, both the address and control signals exchanged between the memory controller or the respective CPU, respectively, and the memory devices, and the corresponding (reference) data signals are buffered by corresponding data buffer devices, in one embodiment AMBs (advanced memory buffers) of the respective FB-DIMM and only then transmitted to the memory devices or the memory controller or the CPU.

In conventional motherboards that are designed for FB-DIMMs, only FB-DIMMs, not, however, the above-mentioned R-DIMMs, unbuffered DIMMs, etc. can, for instance, be used.

FB-DIMMs are substantially more expensive than registered DIMMs and unbuffered DIMMs.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide a novel memory module system, a novel adapter card, and a novel method for operating a memory module system.

One embodiment provides an adapter card including at least one buffer device, and a first plug for connecting the adapter card to a memory module system, and a second plug for connecting the adapter card to a memory module.

The first plug means or mechanism is designed such that the configured card is adapted to be connected via the first plug mechanism to a fully buffered memory module system, and the second plug mechanism is designed such that the adapter card is configured to be connected via the second plug mechanism to a plug using an unbuffered or partially buffered memory module.

Thus, it is possible to also connect, for instance, R-DIMMs, unbuffered DIMMs, etc. to memory module systems that are designed, for instance, for FB-DIMMs.

Figure 1:
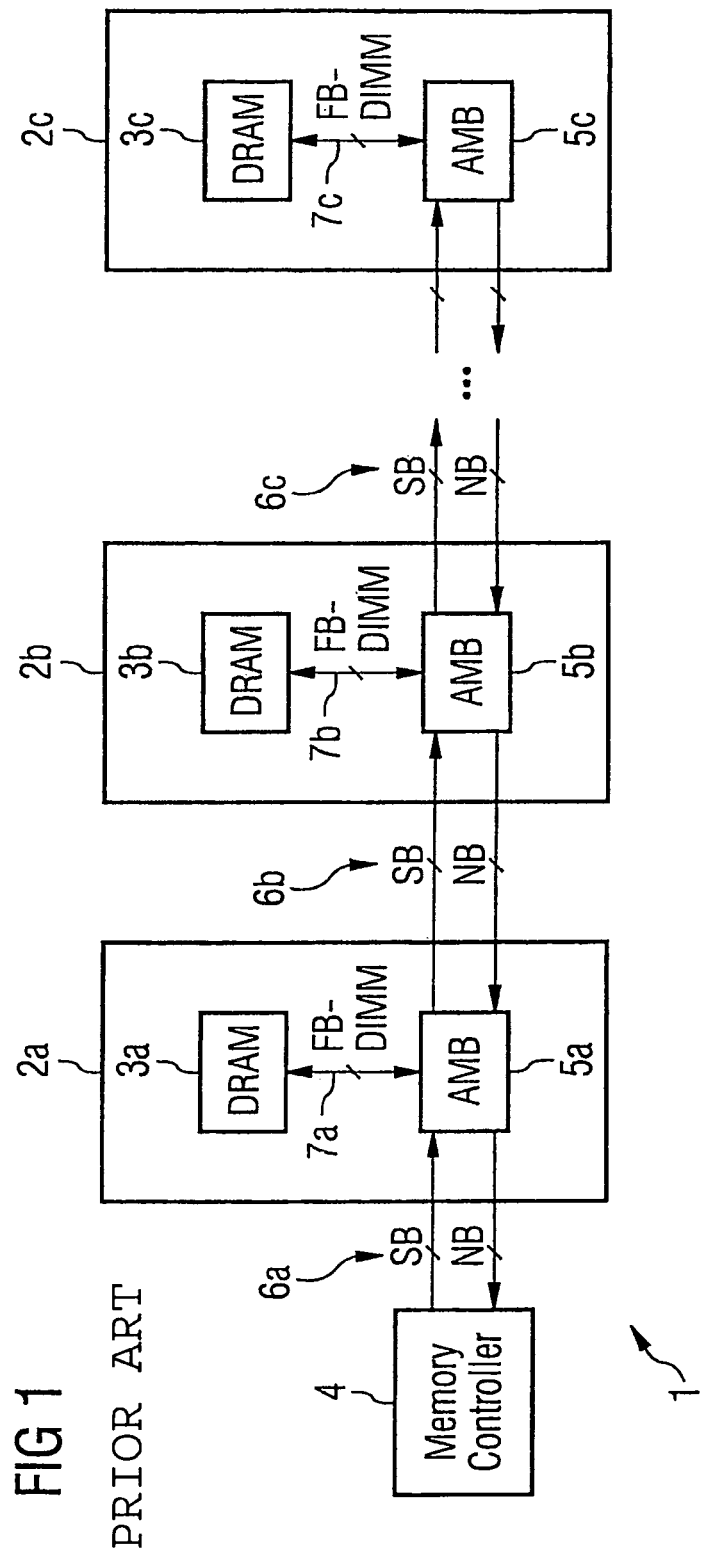
FIG. 1 illustrates a schematic representation of a conventional memory module system designed for FB-DIMMs.

FIG. 1 illustrates by way of example a memory module system 1 with FB-DIMMs 2a, 2b, 2c (FB-DIMM=Fully Buffered DIMM).

In the system 1 illustrated in FIG. 1, up to eight memory modules/FB-DIMMs 2a, 2b, 2c per channel can be connected to a corresponding CPU or memory controller 4, respectively (or, in alternative systems, e.g., more than eight, e.g., up to sixteen, up to twenty-three, etc. memory modules/FB-DIMMs 2a, 2b, 2c per channel, etc.).

Via an appropriate bus (not illustrated), the memory controller 4 may be connected to one or a plurality of CPUs, or may alternatively also be part of a corresponding CPU, i.e. be provided on the same chip as the CPU.

For reasons of better presentability, only one single channel is illustrated in FIG. 1. The memory module system 1 may include more channels than the channel illustrated in FIG. 1, e.g., more than two or four channels, wherein each channel may—like the channel illustrated in FIG. 1—comprise, for instance, up to eight (or alternatively up to sixteen, or up to thirty-two, etc.) FB-DIMMs 2a, 2b, 2c.

As results from FIG. 1, every FB-DIMM 2a, 2b, 2c includes a data buffer device (buffer), in one embodiment an AMB (advanced memory buffer) 5a, 5b, 5c (or alternatively, for instance, more than one, e.g., two buffers), and one or preferably a plurality of memory devices, e.g., a plurality of RAM memory devices, in one embodiment a plurality of SRAMs or DRRAMs, e.g., more than three, seven, or fifteen, for instance, nine or eighteen DRAMs, in one embodiment DDR2 or DDR3-DRAMs (for reasons of better presentability, only one respective DRAM 3a, 3b, 3c per FB-DIMM 2a, 2b, 2c is illustrated in FIG. 1).

Each DRAM 3a, 3b, 3c may, for instance, have a storage capacity of e.g., 256 Mbit, 512 Mbit, 1 Gbit, 2 Gbit, etc. (or more).

The total storage capacity provided by an FB-DIMM 2a, 2b, 2c depends on the number of DRAMs 3a, 3b, 3c provided on an FB-DIMM 2a, 2b, 2c, and on the storage capacity of the individual DRAMs 3a, 3b, 3c, and may, for instance, be 1 Gbyte, 2 Gbyte, etc. (or more).

The FB-DIMMs 2a, 2b, 2c may be plugged into corresponding memory plug contacts of a motherboard/main printed circuit board which includes, for instance, also the above-mentioned CPU(s) or memory controller(s) 4, respectively.

For plugging the FB-DIMMs 2a, 2b, 2c into the memory plug contacts of the motherboard, they may include a corresponding FB-DIMM plug mechanism with, for instance, 240 terminals that can be plugged into a corresponding memory plug contact.

As results from FIG. 1, the CPU/memory controller 4 is connected to the first FB-DIMM 2a (more exactly: its buffer 5a) via a first bus 6a which includes a first channel ("south-bound channel" (SB channel)) and a second channel ("north-bound channel" (NB channel)). The SB channel of the bus 6a is used to send corresponding address, control, and data signals from the CPU/memory controller 4 to the first FB-DIMM 2a. Correspondingly similar, the NB channel of the bus 6a is used to send corresponding signals from the first FB-DIMM 2a to the CPU/memory controller 4.

As results further from FIG. 1, the first FB-DIMM 2a (more exactly: its buffer 5a) may be connected to the second FB-DIMM 2b (more exactly: its buffer 5b) via a second bus 6b which includes, like the first bus 6a, a first channel ("south-bound channel" (SB channel)) and a second channel ("north-bound channel" (NB channel)). Correspondingly similar, the second FB-DIMM 2b (more exactly: its buffer 5b) may be connected to a third FB-DIMM (more exactly: its buffer) via a third bus 6c (which also includes a first channel ("south-bound channel" (SB channel)) and a second channel ("north-bound channel" (NB channel)), etc., etc.

The FB-DIMMs 2a, 2b, 2c operate corresponding to the "daisy chain" principle:

The buffer 5a of the first FB-DIMM 2a (i.e. the first link of the "daisy chain") transmits corresponding data, address, and/or control signals sent from the CPU/memory controller 4 via the "south-bound channel" of the first bus 6a to the first FB-DIMM 2a irrespective of whether the first FB-DIMM 2a or another FB-DIMM is addressed with the signals (and possibly after performing a corresponding signal regeneration)—via the "south-bound channel" of the second bus 6b to the buffer 5b of the second FB-DIMM 2b (i.e. the second link of the "daisy chain").

Correspondingly similar, the buffer 5b of the second FB-DIMM 2b transmits the corresponding data, address, and/or control signals received from the buffer 5a of the first FB-DIMM 2a—irrespective of whether the second FB-DIMM 2b or another FB-DIMM is addressed with the signals (and possibly after performing a corresponding signal regeneration)—via the "south-bound channel" of the third bus 6c to the buffer of the third FB-DIMM (i.e. the third link of the "daisy chain"), etc.

Correspondingly vice versa, the buffer 5b of the second FB-DIMM 2b transmits corresponding signals received from the buffer of the third FB-DIMM via the "north-bound channel" of the third bus 6c (possibly after performing a corresponding signal regeneration) to the buffer 5a of the first FB-DIMM 2a via the "north-bound channel" of the second bus 6b.

The buffer 5a of the first FB-DIMM 2a transmits—in a correspondingly similar manner—the corresponding signals received from the buffer 5b of the second FB-DIMM 2b via the "north-bound channel" of the second bus 6b (possibly after performing a corresponding signal regeneration) to the CPU/memory controller 4 via the "north-bound channel" of the first bus 6a.

The exchange of the data, address, and/or control signals via the above-mentioned busses 6a, 6b, 6c may be performed in correspondence with the FB-DIMM protocol.

As is further illustrated in FIG. 1, every DRAM 3a, 3b, 3c is, via a corresponding bus 7a, 7b, 7c, connected to the corresponding buffer 5a, 5b, 5c of the respective FB-DIMM 2a, 2b, 2c.

Every buffer 5a, 5b, 5c knows its position in the ("daisy") chain. Which of the FB-DIMMs 2a, 2b, 2c is just being addressed by the CPU/memory controller 4, may be determined in the respective buffer 5a, 5b, 5c e.g., by comparing identification data (ID number or slot number) stored in the corresponding buffer 5a, 5b, 5c with identification data sent by the CPU/memory controller 4 via the busses 6a, 6b, 6c and individually characterizing the respective buffer.

The buffer of a respectively addressed FB-DIMM transmits the data, address, and/or control signals received via a corresponding "south-bound channel" of one of the busses 6a, 6b, 6c not just, as described above, to the respectively next link of the above-mentioned "daisy chain" (i.e. to the buffer that follows next in the "daisy chain"), but correspondingly similar address and control as well as data signals—in a time-coordinated, possibly multiplexed or demultiplexed manner, or in a converted form—via the respective bus 7a, 7b, 7c also to the DRAMs 3a, 3b, 3c of the respectively addressed FB-DIMM 2a, 2b, 2c.

Furthermore, signals received by a corresponding buffer 5a, 5b, 5c via the respective bus 7a, 7b, 7c from a DRAM are—in a time-coordinated, possibly multiplexed or demultiplexed manner, or in a converted form—transmitted from the respective buffer 5a, 5b, 5c via a corresponding "north-bound channel" of one of the busses 6a, 6b, 6c to the respectively preceding link of the above-mentioned "daisy chain" (i.e. to the buffer that precedes in the "daisy chain", or—from the buffer 5a of the first FB-DIMM 2a—to the CPU/memory controller 4).

The exchange of the data, address, and/or control signals via the above-mentioned busses 7a, 7b, 7c may be performed at lower frequency than the exchange of the data, address, and/or control signals via the above-mentioned busses 6a, 6b, 6c.

Figure 2:
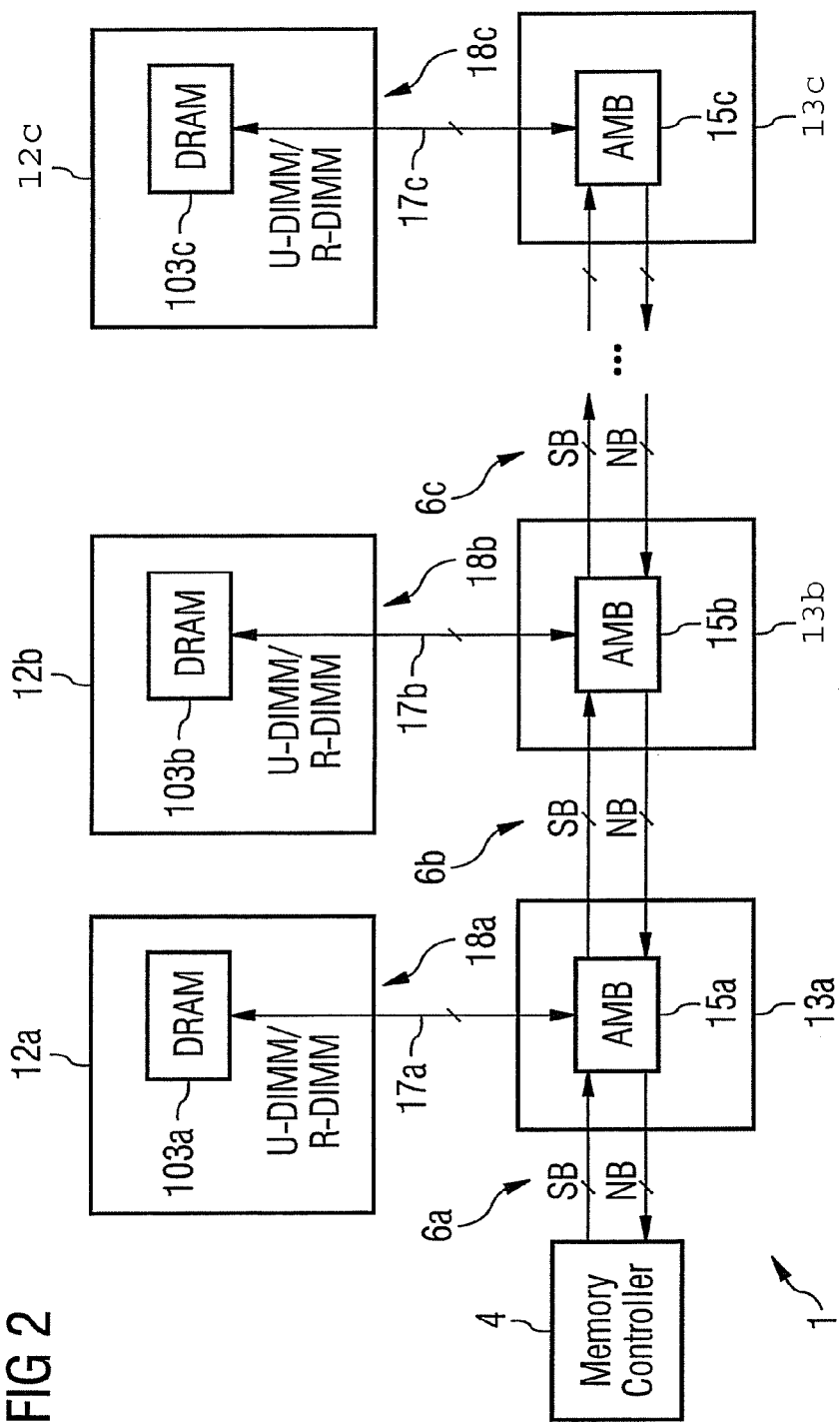
FIG. 2 illustrates a schematic representation of the memory module system illustrated in FIG. 1 in a state in which—instead of corresponding FB-DIMMs—one or a plurality of adapter cards in accordance with one embodiment are connected to the system, which are each connected with corresponding U- or R-DIMMs.

FIG. 2 illustrates a schematic, exemplary representation of the memory module system 1 illustrated in FIG. 1 in a state in which, instead of corresponding FB-DIMMs 2a, 2b, 2b—illustrated in FIG. 1—, one or a plurality of adapter cards 13a, 13b, 13c in accordance with an embodiment of the invention are connected to the system 1, said adapter cards—as will be explained in more detail in the following—being adapted to be connected with corresponding U- or R-DIMMs 12a, 12b, 12c.

The adapter cards 13a, 13b, 13c may be plugged into correspondingly identical motherboard memory plug contacts as the FB-DIMMs 2a, 2b, 2c illustrated in FIG. 1.

Figure 4:
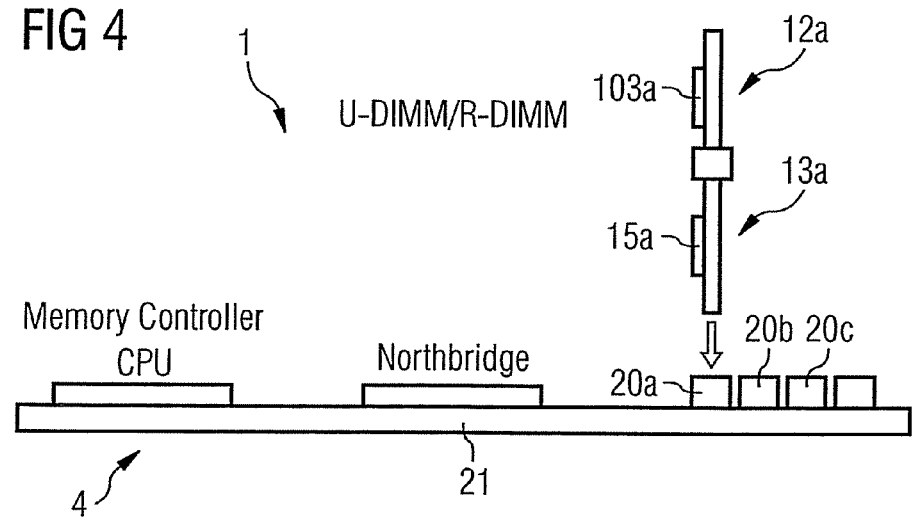
FIG. 4 illustrates a side view of the memory module system illustrated in FIGS. 1 and 2, and of an adapter card connectable thereto, with a U- or R-DIMM connected therewith.

For instance, into a first memory plug contact 20a of the motherboard 21—as is illustrated in FIG. 4—, the adapter card 13a illustrated in FIG. 2 may be plugged instead of the FB-DIMM 2a illustrated in FIG. 1, into a second memory plug contact 20b of the motherboard 21, the adapter card 13b illustrated in FIG. 2 instead of the FB-DIMM 2b illustrated in FIG. 1, and into a third memory plug contact 20c of the motherboard 21, the adapter card 13c illustrated in FIG. 2 instead of the FB-DIMM 2c illustrated in FIG. 1, etc., etc.

Figure 3:
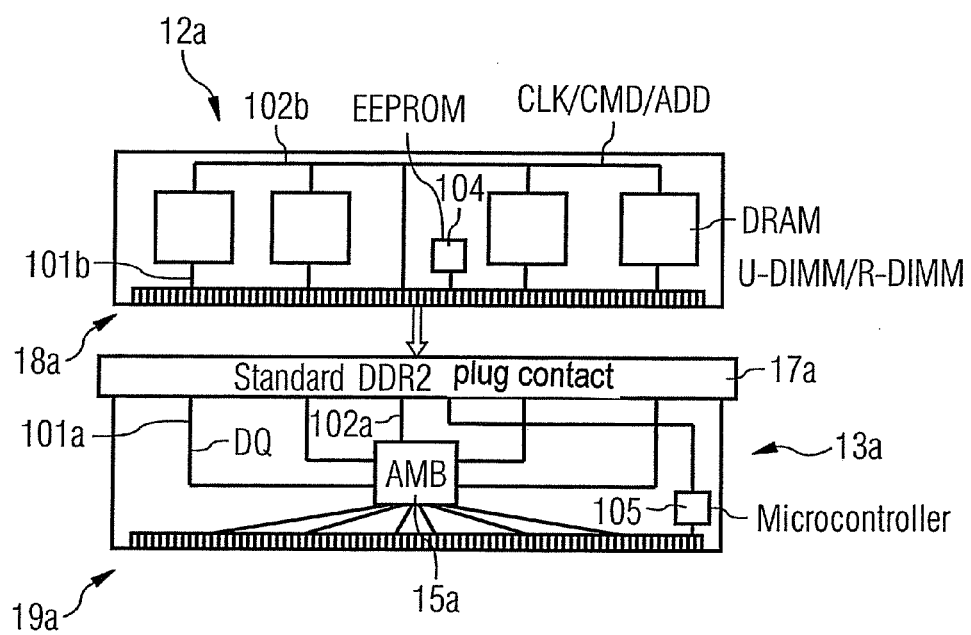
FIG. 3 illustrates a front view of one of the adapter cards illustrated in FIG. 2, and of a U- or R-DIMM connectable therewith.

For plugging the adapter cards 13a, 13b, 13c into the memory plug contacts 20a, 20b, 20c of the motherboard 21, the adapter cards 13a, 13b, 13c may, as is illustrated in FIG. 3, each include a corresponding FB-DIMM plug mechanism 19a, e.g., correspondingly similar or identical to the FB-DIMMs 2a, 2b, 2c illustrated in FIG. 1, an FB-DIMM plug mechanism 19a with, for instance, 240 terminals that can be plugged into a corresponding memory plug contact, e.g., a corresponding printed circuit board edge connector.

In the system 1 illustrated in FIGS. 1, 2, and 4—by plugging the adapter cards 13a, 13b, 13c (in one embodiment the corresponding FB-DIMM plug mechanism 19a) into the above-mentioned memory plug contacts 20a, 20b, 20c of the motherboard—up to eight adapter cards 13a, 13b, 13c per channel may be connected to the corresponding CPU or memory controller 4, respectively (or, in alternative systems, e.g., more than eight, e.g., up to sixteen, up to thirty-two, etc. adapter cards).

For instance, optionally only one single adapter card 13a per channel may be connected to the motherboard 21, or e.g., two or more adapter cards 13a, 13b, 13c.

The remaining memory plug contacts 20a, 20b, 20c of the motherboard—i.e. those memory plug contacts 20a, 20b, 20c into which no adapter card 13a, 13b, 13c was plugged—may stay free. Alternatively, a corresponding FB-DIMM 2a, 2b, 2c may be plugged into one or a plurality of memory plug contacts 20a, 20b, 20c into which no adapter card 13a, 13a, 13c is plugged.

As results from FIGS. 2 and 3, each adapter card 13a, 13b, 13c includes a data buffer device (buffer) 15a, 15b, 15c (or alternatively e.g., more than one, e.g., two buffers), e.g., a corresponding AMB device (AMB=Advanced Memory Buffer).

The data buffer device (buffer) 15a, 15b, 15c provided on an adapter card 13a, 13b, 13c may be constructed and equipped in a correspondingly similar or identical manner as the data buffer device (buffer) 5a, 5b, 5c (AMB device) provided on an FB-DIMM 2a, 2b, 2c and illustrated in FIG. 1.

As results from FIG. 3, the adapter cards 13a, 13b, 13c comprise, at the card edge opposite to the FB-DIMM plug mechanism 19a (i.e. the corresponding printed circuit board edge connector) a memory plug contact 17a, 17b, 17c, e.g., a corresponding standard DDR2 plug contact (or a corresponding standard DDR3 plug contact, etc.).

The memory plug contact 17a, 17b, 17c of an adapter card 13a, 13b, 13c may be constructed in a correspondingly similar or identical manner as a memory plug contact of a motherboard designed for R- or U-DIMMs and provided for plugging in an unbuffered DIMM (U-DIMM) or an R-DIMM (R-DIMM=registered DIMM).

As is illustrated in FIG. 3, a corresponding, conventional U-DIMM 12a, 12b, 12c or a corresponding, conventional R-DIMM 12a, 12b, 12c may optionally be plugged into a corresponding memory plug contact 17a, 17b, 17c of an adapter card 13a, 13b, 13c.

For plugging a U- or R-DIMM 12a, 12b, 12c into an adapter card 13a, 13b, 13c (more exactly: into the memory plug contact 17a, 17b, 17c of an adapter card 13a, 13b, 13c), the U- or R-DIMMs 12a, 12b, 12c may, as illustrated in FIG. 3, each include a corresponding U- or R-DIMM plug mechanism 18a, 18b, 18c, e.g., a corresponding printed circuit board edge connector with, for instance, 168 terminals that can be plugged into a corresponding memory plug contact (84 on every side of the card), or e.g., with 184, 200, 214, or 240 terminals.

The U- or R-DIMM plug mechanism 18a, 18b, 18c may be constructed in a correspondingly similar or identical manner as a conventional plug mechanism provided for plugging the U- or R-DIMM 12a, 12b, 12c into a memory plug contact of a motherboard designed for R- or U-DIMMs.

The U- or R-DIMMs 12a, 12b, 12c may thus, instead into the adapter cards 13a, 13b, 13c illustrated in FIGS. 2, 3, 4 and plugged into the motherboard 21 designed for FB-DIMMs 2a, 2b, 2c, also be plugged into corresponding memory plug contacts of a motherboard designed for the incorporation of R- or U-DIMMs, and be operated therewith.

As results from FIGS. 2, 3, and 4, the R- or U-DIMMs 12a, 12b, 12c include one or preferably a plurality of memory devices, e.g., a plurality of RAM memory devices, in one embodiment a plurality of SRAMs or DRAMs, e.g., more than three, seven, or fifteen, e.g., nine or eighteen DRAMs, in one embodiment DDR1, DDR2, or DDR3-DRAMs (for reasons of better presentability, only one respective DRAM 103a, 103b, 103c per R- or U-DIMM 12a, 12b, 12c is illustrated in FIG. 2).

Each DRAM 103a, 103b, 103c may, for instance, have a storage capacity of e.g., 256 Mbit, 512 Mbit, 1 Gbit, 2 Gbit, etc. (or more).

The total storage capacity provided by an R- or U-DIMM 12a, 12b, 12c depends on the number of DRAMs 103a, 103b, 103c provided on an R- or U-DIMM 12a, 12b, 12c, and on the storage capacity of the individual DRAMs 103a, 103b, 103c, and may, for instance, be 1 Gbyte, 2 Gbyte, etc. (or more).

As results from FIG. 2, by the plugging of the adapter card 13a into the above-mentioned (first) memory plug contact 20a of the motherboard 21, the CPU/memory controller 4 is, via the above-mentioned first bust 6a, the memory plug contact 20a of the motherboard 21, and the plug mechanism 19a of the adapter card 13a, connected to the buffer 15a provided on the adapter card 13a.

Correspondingly, by the plugging of the adapter card 13b into the above-mentioned (second) memory plug contact 20b of the motherboard 21, the adapter card 13a (more exactly: its buffer 15a) is, via the above-mentioned second bus 6b, the memory plug contact 20b of the motherboard 21, and the plug using the adapter card 13b, connected to the buffer 15b provided on the adapter card 13b, and by the plugging of the adapter card 13c into the above-mentioned (third) memory plug contact 20c of the motherboard 21, the adapter card 13b (more exactly: its buffer 15b) is, via the above-mentioned third bus 6c, the memory plug contact 20c of the motherboard 21, and the plug using the adapter card 13c, connected to the buffer 15c provided on the adapter card 13c, etc., etc.

The adapter cards 13a, 13b, 13c with the R- or U-DIMMs 12a, 12b, 12c connected thereto may thus be operated pursuant to the "daisy chain" principle in a correspondingly similar manner as the FB-DIMMs 2a, 2b, 2c illustrated in FIG. 1, The buffer 15a of the first adapter card 13a (i.e. the first link of the "daisy chain") transmits corresponding data, address, and/or control signals sent by the CPU/memory controller 4 via the "south-bound channel" of the first bus 6a to the first adapter card 13a irrespective of whether the first adapter card/the first R- or U-DIMM 12a is addressed with the signals (and possibly after performing a corresponding signal regeneration)—via the "south-bound channel" of the second bus 6b to the buffer 15b of the second adapter card 13b (i.e. the second link of the "daisy chain").

Correspondingly similar, the buffer 15b of the second adapter card 13b transmits the corresponding data, address, and/or control signals received from the buffer 15a of the first adapter card 13a—irrespective of whether the second adapter card/the second R- or U-DIMM 12b, or another adapter card/ R- or U-DIMM is addressed with the signals (and possibly after performing a corresponding signal regeneration)—via the "south-bound channel" of the third bus 6c to the buffer of the third adapter card (i.e. the third link of the "daisy chain"), etc.

Correspondingly vice versa, the buffer 15b of the second adapter card 13b transmits corresponding signals received from the buffer of the third adapter card via the "north-bound channel" of the third bus 6c (possibly after performing a corresponding signal regeneration) to the buffer 15a of the first adapter card 13a via the "north-bound channel" of the second bus 6b.

The buffer 15a of the first adapter card 13a transmits—in a correspondingly similar manner—the corresponding signals received from the buffer 15b of the second adapter card 13b via the "north-bound channel" of the second bus 6b (possibly after performing a corresponding signal regeneration) to the CPU/memory controller 4 via the "north-bound channel" of the first bus 6a.

The exchange of the data, address, and/or control signals via the above-mentioned busses 6a, 6b, 6c may be performed in correspondence with the FB-DIMM protocol.

By using the above-explained plugging of the R- or U-DIMM 12a into the above-mentioned memory plug contact 17a of the adapter card 13a, the buffer 15a of the adapter card 13a is connected, via the memory plug contact 17a of the adapter card 13a and the plug mechanism 18a of the R- or U-DIMM 12a, to the DRAMs 103a provided on the R- or U-DIMM 12a.

Correspondingly, by using the plugging of the R- or U-DIMM 12b into the above-mentioned memory plug contact 17b of the adapter card 13b, the buffer 15b of the adapter card 13b is, via the memory plug contact 17b of the adapter card 13b, and the plug mechanism 18b of the R- or U-DIMM 12b, connected to the DRAMs 103b provided on the R- or U-DIMM 12b, and by the plugging of the R- or U-DIMM 12c into the above-mentioned memory plug contact 17c of the adapter card 13c, the buffer 15c of the adapter card 13c is, via the memory plug contact 17c of the adapter card 13c, and the plug mechanism 18c of the R- or U-DIMM 12c, connected to the DRAMs 103c provided on the R- or U-DIMM 12c, etc., etc.

Each of the buffers 15a, 15b, 15c provided on the adapter cards 13a, 13b, 13c knows its position in the above-mentioned "daisy chain". Which adapter card 13a, 13b, 13c—and thus which of the U- or R-DIMMs 12a, 12b, 12c—is just being addressed by the CPU/memory controller 4 may be determined in the respective buffer 15a, 15b, 15c e.g., by comparing identification data (ID number or slot number) stored in the corresponding buffer 15a, 15b, 15c with identification data sent by the CPU/memory controller 4 via the busses 6a, 6b, 6c and individually characterizing the respective buffer.

The buffer of a respectively addressed adapter card transmits the data, address, and/or control signals received via a corresponding "south-bound channel" of one of the busses 6a, 6b, 6c not just, as described above, to the respectively next link of the above-mentioned "daisy chain" (i.e. to the buffer that follows next in the "daisy chain"), but correspondingly similar address and control as well as data signals—in a time-coordinated, possibly multiplexed or demultiplexed manner, or in a converted form—via the respective adapter memory plug contact 17a, 17b, 17c and the respective plug mechanism 18a, 18b, 18c of the corresponding U- or R-DIMM 12, 12b, 12c also to the DRAMs 103a, 103b, 103c of the respectively addressed U- or R-DIMM 12a, 12b, 12c.

Furthermore, signals received by a corresponding buffer 15a, 15b, 15c from an addressed DRAM via the corresponding U- or R-DIMM plug mechanism 18a, 18b, 18c and the corresponding adapter plug contact 17a, 17b, 17c are—in a time-coordinated, possibly multiplexed or demultiplexed manner, or in a converted form—transmitted from the respective buffer 15a, 15b, 15c via a corresponding "north-bound channel" of one of the busses 6a, 6b, 6c to the respectively preceding link of the above-mentioned "daisy chain" (i.e. to the buffer preceding in the "daisy chain", or—from the buffer 15a of the first adapter card 13a—to the CPU/memory controller 4).

The exchange of the data, address, and/or control signals via the above-mentioned adapter memory plug contacts 17a, 17b, 17c and U- or R-DIMM plug mechanism 18a, 18b, 18c may, for instance, be performed in correspondence with the DDR2 protocol.

The exchange of corresponding (reference) data signals (DQ signals) between the buffer 15a, 15b, 15c of an adapter card 13a, 13b, 13c and the DRAMs 103a, 103b, 103c of a U- or R-DIMM 12a, 12b, 12c may be performed by using corresponding (reference) data lines 101a or 101b provided on the adapter card 13a, 13b, 13c and the U- or R-DIMMs 12a, 12b, 12c, and the exchange of corresponding address and/or control signals (CLK/CMD/ADD signals) by using corresponding address and/or control lines 102a or 102b provided on the adapter card 13a, 13b, 13c and the U- or R-DIMMs 12a, 12b, 12c.

As results from FIG. 3, the U- or R-DIMMs 12a, 12b, 12c comprise, like conventional U- or R-DIMMs, a non-volatile memory mechanism, in one embodiment an EEPROM 104 (EEPROM=Electrically Erasable Programmable Read-Only Memory).

An appropriate SPD code (SPD code=Serial Presence Detect code) may be stored on the EEPROM 104.

By using the SPD code, the DIMM capacity, the DIMM timing parameters, etc. of the respective U- or R-DIMM 12a, 12b, 12c—i.e. data characterizing the respective DIMM 12a, 12b, 12c—may, for instance, be indicated.

As results further from FIG. 3, a microcontroller 105 may be provided on the adapter cards 13a, 13b, 13c in addition to the buffer 15a, 15b, 15c.

The microcontroller 105 may be connected via corresponding lines provided on the adapter card 13a, 13b, 13c and the U- or R-DIMM 12a, 12b, 12c—and via the above-mentioned adapter plug contact 17a, 17b, 17c and the above-mentioned U- or R-DIMM plug mechanism 18a, 18b, 18c—to the EEPROM 104 provided on the U- or R-DIMM 12a, 12b, 12c.

On initialization of the memory module system 1, the microcontroller 105 provided on the adapter card 13a, 13b, 13c reads out the SPD code stored on the EEPROM 104 of the U- or R-DIMM 12a, 12b, 12c connected to the adapter card 13a, 13b, 13c, and generates therefrom an SPD code which is possibly correspondingly modified vis-à-vis the read-out SPD code. This (modified) SPD code (which corresponds to the FB-DIMM standard) is stored by the microcontroller 105 on a corresponding BIOS component (BIOS=Basic Input Output System) provided on the motherboard 21. Thus, it is possible to connect a plurality of different DIMMs, in one embodiment DDR2 or DDR3-DIMMs (e.g., the above-mentioned U- or R-DIMMs 12a, 12b, 12c or a plurality of different variants thereof) to one and the same adapter card 13a, 13b, 13c.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory module system comprising:
a main printed circuit board;
an adapter card comprising a data buffer device and a controller, the adapter card directly physically coupled to the main printed circuit board;
at least one memory module card that is coupled to the main printed circuit board via the adapter card, the at least one memory module card comprising a non-volatile memory communicatively coupled to the controller of the adapter card;
a further adapter card comprising a further data buffer device, the further adapter card directly physically coupled to the main printed circuit board; and
at least one further memory module card that is coupled to the main printed circuit board via the further adapter card;
wherein the adapter card is configured such that at least one of data, address, and control signals received by the adapter card via a first connection and the data buffer device are transmitted by the adapter card via a second connection and the data buffer device to the further data buffer device of the further adapter card.

2. The memory module system of claim 1, wherein the adapter card is configured such that at least one of the data, address, and control signals received by the adapter card via the first connection are transmitted by the adapter card via the second connection to the further memory module card.

3. The memory module system of claim 1, wherein the adapter card comprises an advanced memory buffer.

4. The memory module system of claim 1, wherein the adapter card is connected to the memory module system via a plug contact of the main printed circuit board of the memory module system.

5. The memory module system of claim 1, wherein the memory module system is a fully buffered memory module system.

6. The memory module system of claim 1, wherein the memory module card is an unbuffered or a partially buffered memory module card.

7. The memory module system of claim 6, wherein the unbuffered memory module card is an unbuffered Dual In-Line Memory Module (U-DIMM) card.

8. The memory module system of claim 1, wherein the memory module card is a registered Dual In-Line Memory Module (R-DIMM) card.

9. A method for operating a memory module system, the method comprising:
receiving at least one of data, address, and control signals by a data buffer device of an adapter card, which is directly physically coupled to a motherboard of the memory module system and to which a memory module card is connected;
transmitting the received at least one of data, address, and control signals by the data buffer device of the adapter card to a further adapter card; and
communicatively coupling a non-volatile memory of the memory module card to a controller of the adapter card,
wherein the further adapter card is directly physically coupled to the motherboard of the memory module system and a further memory module.

10. The method of claim 9, comprising performing a signal regeneration prior to the transmission of at least one of the data, address, and control signals.

11. A system comprising:
a motherboard;
a memory controller coupled to the motherboard;
a first adapter card comprising an advanced memory buffer, a microcontroller, a first plug mechanism and a second plug mechanism;
a second adapter card comprising an advanced memory buffer, a microcontroller, a first plug mechanism and a second plug mechanism;
a first memory module card comprising volatile memory and non-volatile memory, the first plug mechanism of the first adapter card configured to couple the first adapter card to the first memory module card, and the second plug mechanism of the first adapter card configured to couple the first adapter card to the second adapter card via the motherboard; and
a second memory module card comprising volatile memory and non-volatile memory, the first plug mechanism of the second adapter card configured to couple the second adapter card to the second memory module card, and the second plug mechanism of the second adapter card configured to couple the second adapter card to the motherboard, wherein the memory controller is communicatively coupled to the advanced memory buffer of the first adapter card via a first bus, wherein the advanced memory buffer of the first adapter card is communicatively coupled to the advanced memory buffer of the second adapter card via a second bus, wherein the microcontroller of the first adapter card is communicatively coupled to the non-volatile memory of the first memory module card via the first plug mechanism of the first adapter card, and wherein the microcontroller of the second adapter card is communicatively coupled to the non-volatile memory of the second memory module card via the first plug mechanism of the second adapter card.

12. An adapter card comprising:
at least one buffer device;
a first plug mechanism configured for directly physically connecting the adapter card to a main printed circuit board of a memory module system;
a second plug mechanism configured for directly physically connecting the adapter card to a memory module; and
a controller for reading out data stored in non-volatile memory on the memory module via the second plug mechanism,
wherein the adapter card is configured such that at least one of data, address, and control signals received by the adapter card via a first connection and the at least one data buffer device are transmitted by the adapter card via a second connection and the at least one data buffer device to a further adapter card, and
wherein the further adapter card is configured to be directly physically coupled to the main printed circuit board and a further memory module.

13. The adapter card of claim 12, wherein the first plug mechanism is configured such that the adapter card can be connected to a fully buffered memory module system via the first plug mechanism.

14. The adapter card of claim 13, wherein the fully buffered memory module system is a fully buffered Dual In-Line Memory Module (FB-DIMM) memory module system.

15. The adapter card of claim 12, wherein the first plug mechanism is configured such that the adapter card can be connected to a plug contact of the main printed circuit board of the memory module system via the first plug mechanism.

16. The adapter card of claim 12, wherein the second plug mechanism is configured such that the adapter card can be connected to a plug using an unbuffered or partially buffered memory module via the second plug mechanism.

17. The adapter card of claim 16, wherein the unbuffered memory module is an unbuffered Dual In-Line Memory Module (U-DIMM).

18. The adapter card of claim 12, wherein the memory module is a registered Dual In-Line Memory Module (R-DIMM).

19. The adapter card of claim 12, wherein the first plug mechanism is a printed circuit board edge connector.

20. The adapter card of claim 12, wherein the controller comprises a microcontroller.

21. The adapter card of claim 12, wherein the controller is configured for reading out data stored in the non-volatile memory on the memory module that characterize properties of the memory module.

22. The adapter card of claim 12, wherein the data comprise Serial Presence Detect (SPD) code data.

23. The adapter card of claim 12, wherein the controller is configured for storing the read-out data, or data generated therefrom, on the main printed circuit board of the memory module system.

* * * * *